United States Patent
Nozaki et al.

(10) Patent No.: US 9,152,055 B2
(45) Date of Patent: Oct. 6, 2015

(54) OPTICAL IRRADIATION APPARATUS WITH SUPER LUMINESCENT DIODES

(75) Inventors: Shinichiro Nozaki, Kyoto (JP); Kazuhiko Yamanaka, Osaka (JP); Shinichi Takigawa, Osaka (JP); Takuma Katayama, Kyoto (JP); Yosuke Mizuyama, Newton, MA (US)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 687 days.

(21) Appl. No.: 13/335,260

(22) Filed: Dec. 22, 2011

(65) Prior Publication Data

US 2012/0320561 A1   Dec. 20, 2012

(30) Foreign Application Priority Data

Jun. 20, 2011 (JP) ................... 2011-136207

(51) Int. Cl.
*F21V 7/04* (2006.01)
*G03F 7/20* (2006.01)
*G02B 27/09* (2006.01)
*G02B 19/00* (2006.01)
*H01L 21/268* (2006.01)
*H01L 27/15* (2006.01)

(52) U.S. Cl.
CPC .......... *G03F 7/2051* (2013.01); *G02B 19/0057* (2013.01); *G02B 27/0905* (2013.01); *G02B 27/0994* (2013.01); *H01L 21/268* (2013.01); *H01L 27/15* (2013.01)

(58) Field of Classification Search
CPC ........................................................ F21V 9/14
USPC ........................................................ 362/555
See application file for complete search history.

(56) References Cited

U.S. PATENT DOCUMENTS

| | | | |
|---|---|---|---|
| 5,809,052 A | 9/1998 | Seko et al. | |
| 6,614,966 B2 * | 9/2003 | Kitaoka et al. | 385/52 |
| 7,719,738 B2 | 5/2010 | Abu-Ageel | |
| 2003/0189960 A1 * | 10/2003 | Kitaoka et al. | 372/36 |
| 2004/0109164 A1 * | 6/2004 | Horii et al. | 356/479 |
| 2007/0047221 A1 * | 3/2007 | Park | 362/97 |
| 2009/0034289 A1 * | 2/2009 | Bu et al. | 362/608 |
| 2009/0201668 A1 * | 8/2009 | Ogiro et al. | 362/97.2 |
| 2009/0231718 A1 * | 9/2009 | Muenz et al. | 359/626 |
| 2010/0215072 A1 | 8/2010 | Funabashi | |
| 2010/0302775 A1 | 12/2010 | Hata | |

FOREIGN PATENT DOCUMENTS

| | | |
|---|---|---|
| JP | 7-98402 A | 4/1995 |
| JP | 08-083925 | 3/1996 |
| JP | 2009-271406 A | 11/2009 |

* cited by examiner

*Primary Examiner* — Anh Mai
*Assistant Examiner* — Hana Featherly
(74) *Attorney, Agent, or Firm* — McDermott Will & Emery LLP

(57) ABSTRACT

An optical irradiation apparatus includes: a light-emitting device configured to emit a plurality of light beams whose optical axes extend in a substantially identical direction; a collimator part configured to convert the light beams into parallel light beams; and a light condensing part configured to collect the parallel light beams. The light-emitting device includes a super luminescent diode array in which a plurality of waveguides are provided on a substrate. Each of the waveguides has a light-emitting facet including a light emission point from which an associated one of the light beams is emitted. The light emission points are located in a plane. The plane including the light emission points is orthogonal to a direction of an optical axis of the collimator part.

20 Claims, 17 Drawing Sheets

OPTICAL IRRADIATION APPARATUS WITH SUPER LUMINESCENT DIODES

CROSS-REFERENCE TO RELATED APPLICATION

This application claims priority to Japanese Patent Application No. 2011-136207 filed on Jun. 20, 2011, the disclosure of which including the specification, the drawings, and the claims is hereby incorporated by reference in its entirety.

BACKGROUND

The present disclosure relates to optical irradiation apparatus, and more particularly to an optical irradiation apparatus which heats an irradiation object or causes photochemical reaction in the irradiation object.

In recent years, attention has been given to techniques of heating an irradiation object or causing photochemical reaction in the irradiation object by optical irradiation. For example, a technique of partially heating a semiconductor or a metal to a temperature equal to or higher than the melting point by optical irradiation to achieve a joint (welding) has been investigated. In addition, a technique of partially heating amorphous silicon on glass by optical irradiation to change the amorphous silicon into microcrystalline silicon in order to enhance a thin film transistor (TFT) is examined. Further, for example, a technique of activating impurities by optical irradiation to enhance properties of a semiconductor doped with the impurities is also investigated.

An optical irradiation apparatus for optical irradiation includes: a semiconductor light-emitting device serving as a light source; and a light collection optical system collecting light emitted from the semiconductor light-emitting device in a predetermined region of an irradiation object. To heat the irradiation object or cause photochemical reaction in the irradiation object, a semiconductor light-emitting device needs to obtain a light output of about 1 W to about 100 W. To uniformly change properties of the optical irradiation region, the light collection optical system needs to show a uniform distribution of the irradiating light intensity in the light collection region.

Examples of known semiconductor light-emitting devices include light emitting diodes (LEDs) and semiconductor laser devices. However, it is difficult for a single LED or semiconductor laser device to obtain a sufficient light output as an optical irradiation apparatus. Thus, a semiconductor light-emitting device needs to be constituted by a plurality of LEDs or semiconductor laser devices, for example, and a coupling optical system coupling light outputs of these devices.

In particular, semiconductor lasers devices have high directivities and can enhance the coupling efficiency of a coupling optical system, and thus, are preferable as a light source of an optical irradiation apparatus. In addition, if a semiconductor laser array in which a plurality of semiconductor laser devices are integrated on one chip is employed, or such semiconductor laser arrays are stacked on one package, size reduction and high output can be achieved. However, when outputs of semiconductor laser devices are coupled together, interference occurs among light beams emitted from the semiconductor laser devices. Accordingly, in a case where the light beams are collected on one place by a light collection optical system, light distribution cannot gradually varies because of interference noise, resulting in a limitation in enlarging a region where uniform light distribution is obtained.

To reduce the interference noise, a technique of converging light emitted from, for example, a semiconductor laser device into light with low interference is proposed (see, for example, U.S. Pat. No. 7,719,738). Specifically, an optical element including: a highly reflective mirror having an aperture; a plano-concave lens provided in the aperture; a light guide for guiding light which has passed through the aperture; and a partially reflective mirror provided at the tip of the light guide is used to convert light emitted from, for example, a semiconductor laser device into light having a low interference property.

The concave lens changes light emitted from a light source such as a semiconductor laser device into light expanding in the radiation direction, and the expanded light enters the optical waveguide. Part of the light which has entered the optical waveguide is emitted directly from the partial reflection mirror. Another part of the light is reflected multiple times between the partial reflection mirror and the high reflection mirror, and then is emitted from the partial reflection mirror. Accordingly, light emitted from the partial reflection mirror is a mixture of various light beams having a difference in optical path length which is an even-numbered multiple of the length of the optical waveguide. By preventing the length of the optical waveguide from being a multiple of ¼ of the wavelength of incident light, it is possible to avoid resonance of light emitted from the partial reflection mirror. As a result, light emitted from, for example, the semiconductor laser device can be converted into light with low interference.

Such use of light with reduced interference is expected to enable light with a uniform distribution to be applied to a wide region.

SUMMARY

However, an optical irradiation apparatus using the conventional optical elements described above involves a problem of an increased number of parts. In the case of using the conventional optical elements, the same number of optical elements as that of semiconductor light-emitting elements are needed. In addition, a reflection loss exists between the high reflection mirror and the partial reflection mirror, and thus, the intensity of emitted light decreases, thereby deteriorating the electric power-light conversion efficiency of the semiconductor light-emitting device.

A possible technique is to couple light beams emitted from a plurality of light-emitting elements using optical fibers in order to avoid interference. However, this technique has a problem of difficulty in size reduction.

It is therefore an object of the present disclosure to provide an optical irradiation apparatus capable of efficiently applying light with high light output and low interference noise.

To achieve the object, according to the present disclosure, an optical irradiation apparatus is configured such that a plurality of light emission points are included in one light emission plane, and the light emission plane is perpendicular to an optical axis of light condensing part.

Specifically, a first example optical irradiation apparatus includes: a light-emitting device configured to emit a plurality of light beams whose optical axes extend in a substantially identical direction; a collimator part configured to convert the light beams into parallel light beams; and a light condensing part configured to collect the parallel light beams, wherein the light-emitting device includes a super luminescent diode array in which a plurality of waveguides are provided on a substrate, each of the waveguides has a light-emitting facet including a light emission point from which an associated one of the light beams is emitted, the light emission points are located in a plane, and the plane including the light emission points is orthogonal to a direction of an optical axis of the collimator part.

In the first example optical irradiation apparatus, the light-emitting device as a light source includes a super luminescent diode array in which a plurality of waveguides are provided on a substrate. Each of the waveguides has a light-emitting facet including a light emission point from which an associated one of the light beams is emitted. The light emission points are located in a plane. The plane including the light emission points is orthogonal to a direction of an optical axis of the collimator part. Accordingly, interference noise hardly occurs in applying light onto an irradiation object, and a predetermined region can be irradiated with light showing a substantially uniform distribution of the irradiating light intensity. In addition, light emitted from the super luminescent diode array can be applied onto the irradiation object without a complicated optical system, thereby achieving an optical irradiation apparatus with a small optical loss and a high efficiency. In addition, the number of parts does not increase, thus achieving size reduction.

A second example optical irradiation apparatus includes: a light-emitting device configured to emit a plurality of light beams whose optical axes extend in a substantially identical direction; a collimator part configured to convert the light beams into parallel light beams; and a light condensing part configured to collect the parallel light beams, wherein the light-emitting device includes a plurality of super luminescent diodes each including a waveguide, the waveguide has a light-emitting facet including a light emission point from which an associated one of the light beams is emitted, the light emission points are located in a plane, and the plane is orthogonal to a direction of an optical axis of the collimator part.

BRIEF DESCRIPTION OF THE DRAWINGS

FIG. 2(a) is a top view, and FIG. 2(b) is a cross-sectional view taken along line Ib-Ib in FIG. 2(a).

FIG. 2(a) illustrates the conventional super luminescent diode array, and FIG. 2(b) illustrates the super luminescent diode array of the first embodiment.

FIG. 5(a) is a plan view, and FIG. 5(b) is a cross-sectional view.

FIG. 6(a) is a plan view, and FIG. 6(b) is a cross-sectional view.

FIG. 7(a) is a plan view, and FIG. 7(b) is a cross-sectional view.

FIG. 8(a) is a plan view, and FIG. 8(b) is a cross-sectional view.

FIG. 9(a) is a plan view, and FIG. 9(b) is a cross-sectional view.

DETAILED DESCRIPTION

First Embodiment

Figure 1:
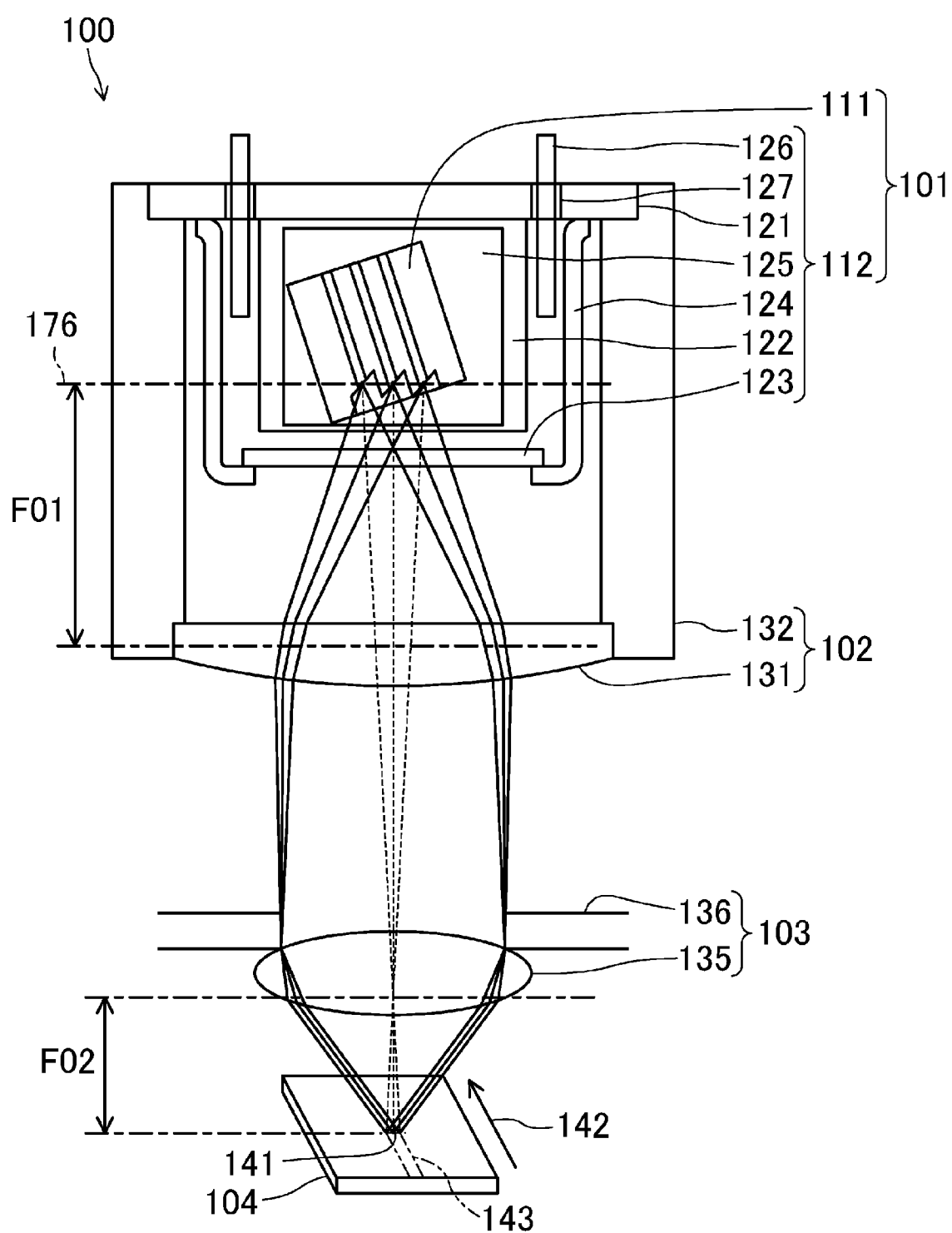
FIG. 1 is a view schematically illustrating an optical irradiation apparatus according to a first embodiment.

As illustrated in FIG. 1, an optical irradiation apparatus according to a first embodiment includes: a semiconductor light-emitting device 101 serving as a light source; a collimator part 102 configured to convert light beams emitted from the semiconductor light-emitting device 101 into parallel light beams; and a light condensing part 103 configured to collect the parallel light beams on a predetermined region of an irradiation object 104. The parallel light beams herein include not only perfectly parallel light beams which do not expand, but also light beams which have an expansion angle of several degrees to over ten degrees.

The semiconductor light-emitting device 101 includes: a super luminescent diode array 111 having a plurality of ridges; and a case 112 housing the super luminescent diode array 111. The case 112 includes: a base 121; a heat sink 122 fixed to project from the base 121; a cap 124 covering the heat sink 122 and having an opening from which light is emitted; and a cover glass 123 attached to the opening of the cap 124. A lead 126 for supplying electric power to the super luminescent diode array 111 is fixed to the base 121 with an insulator 127 such as glass interposed therebetween.

The super luminescent diode array 111 is fixed to the heat sink 122 with a submount 125 interposed therebetween such that a light emission plane 176 is in parallel with a collimator lens 131. The light emission plane 176 of the super luminescent diode array 111 is a plane including the light emission points of the ridges of the super luminescent diode array 111.

The collimator part 102 includes the collimator lens 131, and a first fixture part 132 fixing the collimator lens 131 to the semiconductor light-emitting device 101. The distance between the light emission plane 176 of the super luminescent diode array 111 and the collimator lens 131 is adjusted to an incident focal length F01. The light condensing part 103 includes a condenser lens 135 and a second fixture part 136 fixing the condenser lens 135 to the semiconductor light-emitting device 101. The distance between the condenser lens 135 and the irradiation object 104 is adjusted to an irradiation focal length F02. An irradiation location 141 of light condensed by the condenser lens 135 is scanned along a scanning direction 142, and the scanning history corresponds an irradiation region 143.

Figure 2A:
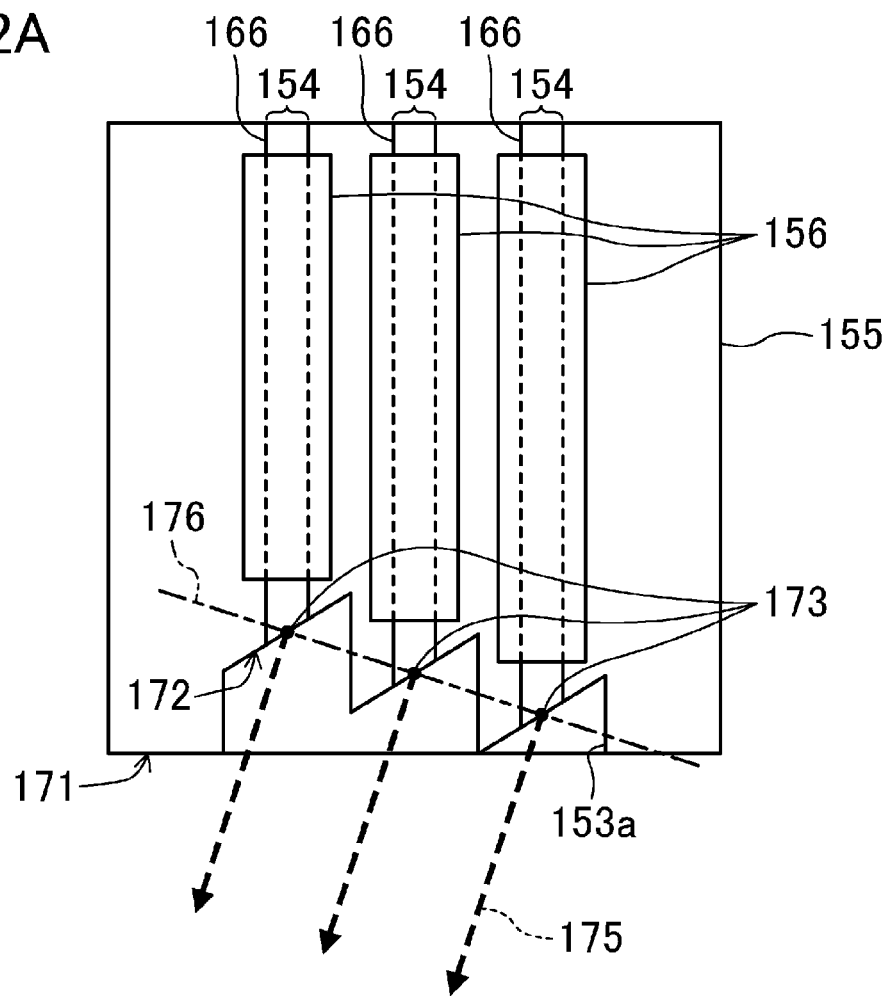
FIGS. 2(a) and 2(b) illustrate a super luminescent diode array according to the first embodiment.
Figure 2B:
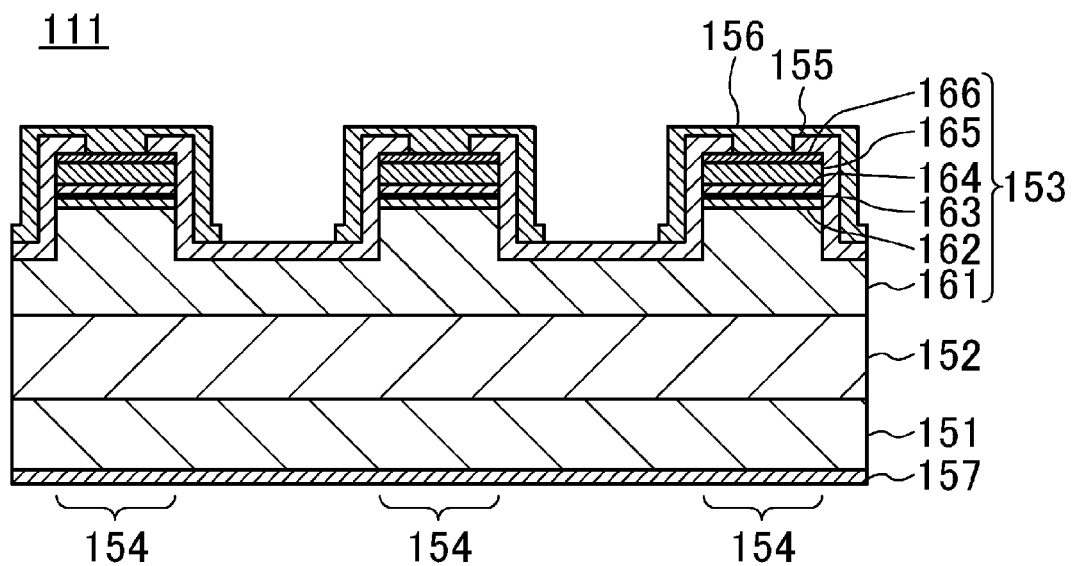

As illustrated in FIGS. 2(a) and 2(b), the super luminescent diode array 111 includes a semiconductor laminated structure 153 formed on a substrate 151 of single crystal of gallium nitride (GaN) with an n-type buffer layer 152 of GaN interposed therebetween. The semiconductor laminated structure 153 includes an n-type cladding layer 161, an n-type guide layer 162, a light-emitting layer 163, a p-type guide layer 164, a p-type cladding layer 165, and a p-type contact layer 166, stacked in this order on the substrate 151, for example. Layers from the p-type contact layer 166 to the n-type guide layer 162 and part of the n-type cladding layer 161 are selectively removed, thereby forming a plurality of strips of ridges 154 extending in the same direction. These ridges 154 form waveguides in which light is confined.

An electrically insulating protection layer 155 of, for example, silicon dioxide ($SiO_2$) or silicon nitride (SiN) is formed on the semiconductor laminated structure 153. The protection layer 155 has openings in which the upper surfaces of the ridges 154 are exposed. P-side electrodes 156 are formed on the protection layer 155 to be in contact with the p-type contact layer 166 in the openings. The p-side electrodes 156 are associated with the respective ridges 154 and independent of each other. An n-side electrode 157 is formed on the surface (i.e., the back surface) of the substrate 151 opposite to the surface thereof facing the semiconductor laminated structure 153. The p-side electrodes 156 may be made of an alloy layer containing palladium (Pd) or platinum (Pt), for example. A transparent conductive layer of, for example, indium tin oxide (ITO) may be provided between the alloy layer and the p-type contact layer 166. The transparent conductive layer can confine light therein, thereby enabling reduction of the thickness of the p-type cladding layer 165. Accordingly, the working voltage can be reduced, thereby increasing the light-emission efficiency.

A front-end surface 171, which is a cleavage plane of the super luminescent diode array 111, has grooves 153a. A light-emitting facet 172 of each of the ridges 154 is inclined at a predetermined angle to the direction along which the ridge 154 extends. Accordingly, the optical axes of light beams emitted from light emission points 173 of the ridges 154 are arranged in the same direction within a margin of errors. The light emission points 173 of the ridges 154 are arranged on a line in plan view. In cross section, the light emission points 173 are arranged within the same plane (i.e., a light emission plane) 176. Each of the optical axes 175 of light beams emitted from the light emission points 173 is orthogonal to a line connecting the light emission points 173. When viewed as a plane, each of the optical axes 175 of the light beams is orthogonal to the light emission plane 176.

Figure 3A:
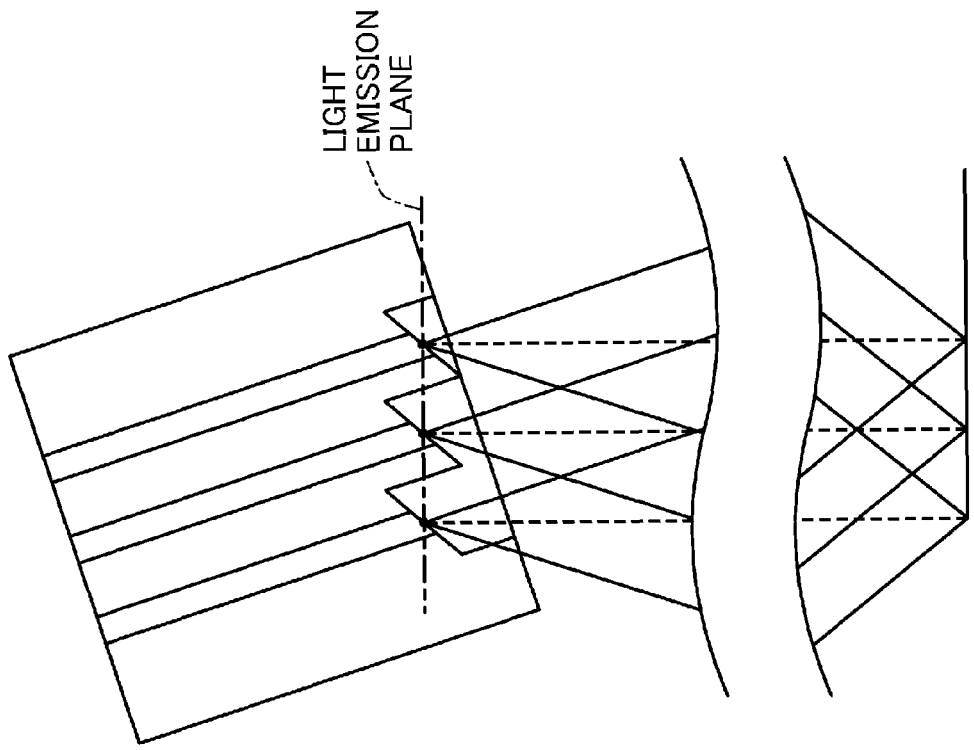
FIGS. 3(a) and 3(b) are plan views for comparison between a conventional super luminescent diode array and the super luminescent diode array of the first embodiment.
Figure 3B:
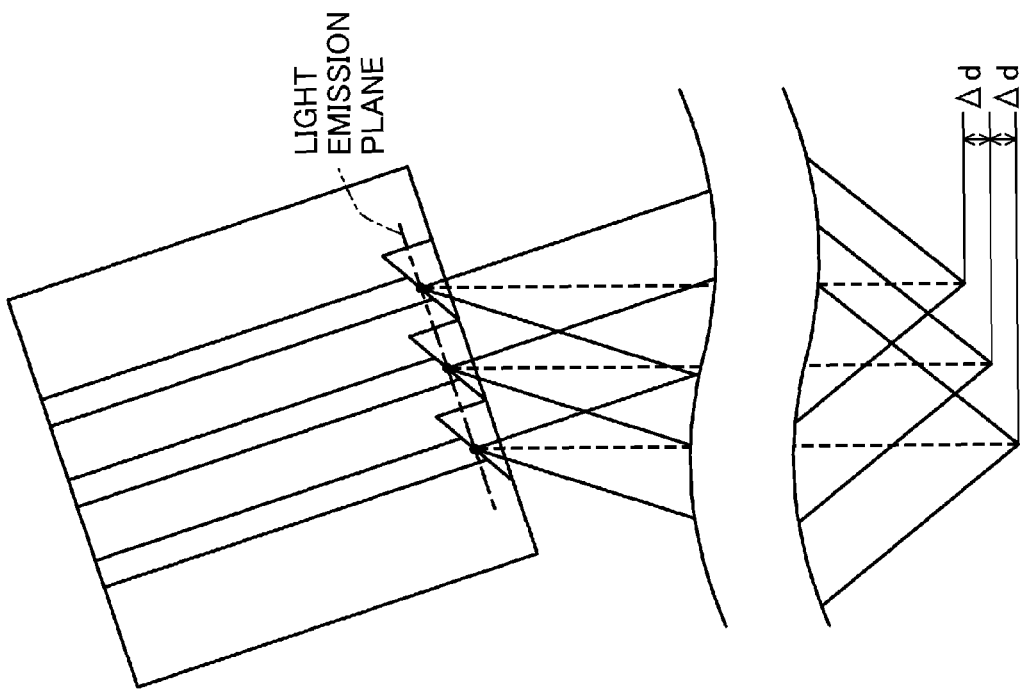

In a general super luminescent diode, the light-emitting facet is inclined in the direction along which the ridge extends in order to reduce a reflection factor in the facet. Accordingly, the optical axis of a light beam emitted from the light emission point is inclined with respect to the direction along which the ridge as a waveguide extends. In a configuration in which ridges with the same structure are arranged in parallel to form an array in the same chip, the light emission plane including the light emission points of the ridges is not perpendicular to the optical axes of light beams emitted from the light emission points, as illustrated in FIG. 3(a). Accordingly, light collection spots of the light beams emitted from the ridges shift by Δd from each other, thereby causing a so-called light collection displacement. As a result, the light beams cannot be focused on the same plane. On the other hand, as illustrated in FIG. 3(b), in a configuration in which the positions of the light-emitting facets of the ridges are adjusted such that the light emission plane including the light emission points is perpendicular to the optical axes of light beams emitted from the light emission points, the light collection displacement can be prevented. With this configuration, the light collection displacement can also be prevented not only in a case where the optical axis of irradiating light is perpendicular to the irradiation surface but also in a case where the optical axis of the irradiating light is inclined to the irradiation surface. By inclining the optical axis of the irradiating light to the irradiation surface, light reflected on the irradiation surface serves as feedback light, thereby reducing oscillation of the super luminescent diode.

Figure 4:
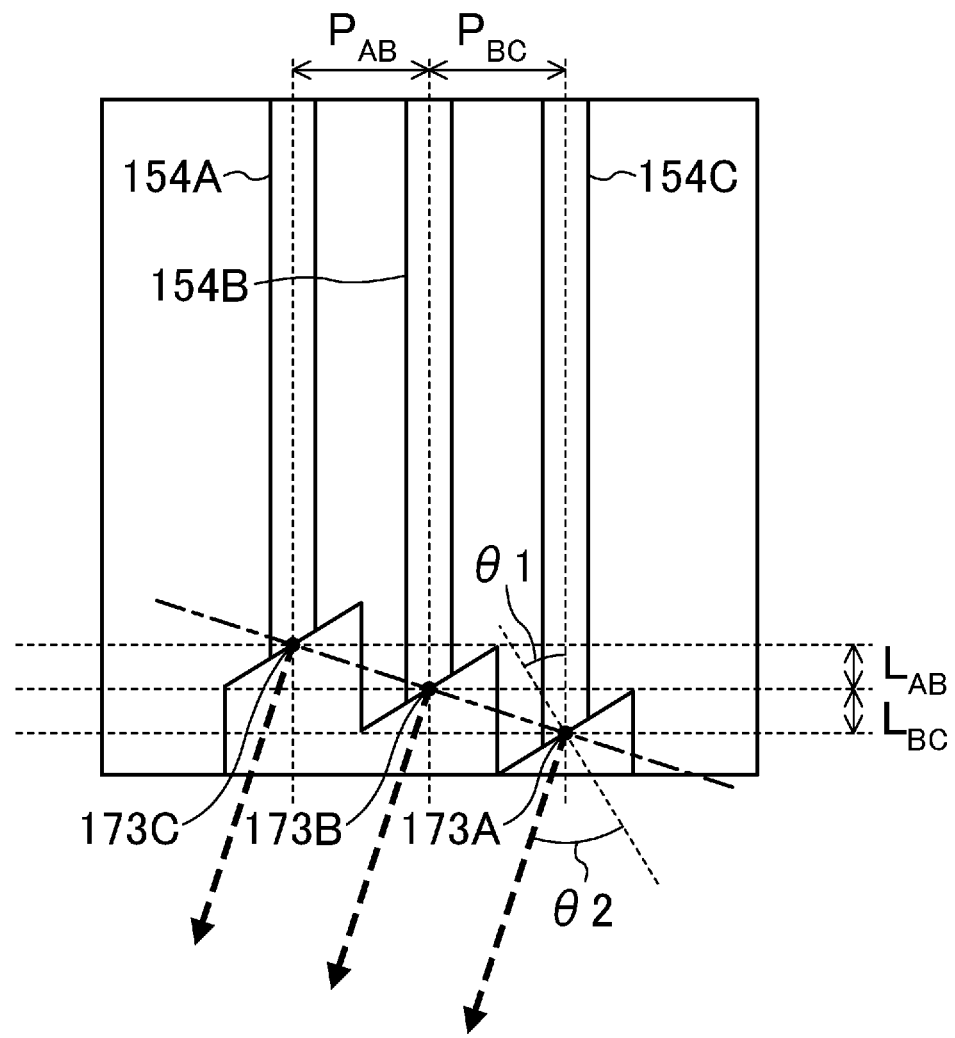
FIG. 4 is a plan view for explaining parameters of the super luminescent diode array of the first embodiment.

A specific structure of the ridges will be described with reference to FIG. 4. In FIG. 4, reference character $P_{AB}$ denotes a distance between the center axis of a first ridge 154A and the center axis of a second ridge 154B, reference character $P_{BC}$ denotes a distance between the center axis of the second ridge 154B and the center axis of a third ridge 154C. Reference character $L_{AB}$ denotes a distance between a first light emission point 173A of the first ridge 154A and a second light emission point 173B of the second ridge 154B, and reference character $L_{BC}$ denotes a distance between the second light emission point 173B of the second ridge 154B and a third light emission point 173C of the third ridge 154C. Reference character θ1 is an angle between the normal of the light-emitting facet of a ridge and the center axis of the ridge, and reference character θ2 denotes an angle between the normal of the light-emitting facet of a ridge and the optical axis of a light beam emitted from the ridge. In this case, θ2 is expressed by the following equation (1):

$$\theta 2 = \arcsin(1/n \times \sin \theta 1) \quad (1)$$

where n is a refractive index of the ridge. Suppose θ1 is 10°, and n is 2.4, θ2 is 24.6°. The distances $L_{AB}$ and $L_{BC}$ are respectively expressed by the following equations (2) and (3):

$$L_{AB} = P_{AB}/\tan(\theta 1 + (90 - \theta 2)) \quad (2)$$

$$L_{BC} = P_{BC}/\tan(\theta 1 + (90 - \theta 2)) \quad (3)$$

If $P_{AB}$ is equal to $P_{BC}$, $L_{AB}$ is equal to $L_{BC}$. Suppose $P_{AB}$ and $P_{BC}$ are 100 μm, $L_{AB}$ and $L_{BC}$ are 26.1 μm.

As described above, the light emission points of adjacent ridges are shifted by 26.1 μm from each other along the direction in which the ridges extend, thereby enabling the first light emission point 173A, the second light emission point 173B, and the third light emission point 173C to be arranged within a plane perpendicular to the optical axes of light beams to be emitted. In a configuration in which the light emission plane including the light emission points is perpendicular to the optical axes of the collimator lens and the condenser lens, no light collection displacement occurs, and light beams emitted from the light emission points can be applied to a predetermined irradiation surface.

Figure 5A:
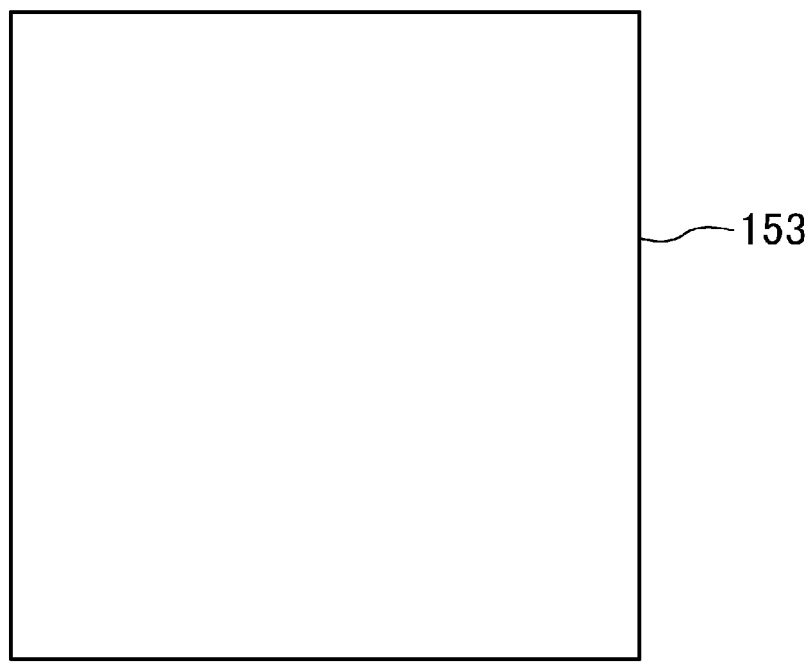
FIGS. 5(a) and 5(b) illustrate a step of a fabrication process of a super luminescent diode array according to the first embodiment.
Figure 5B:
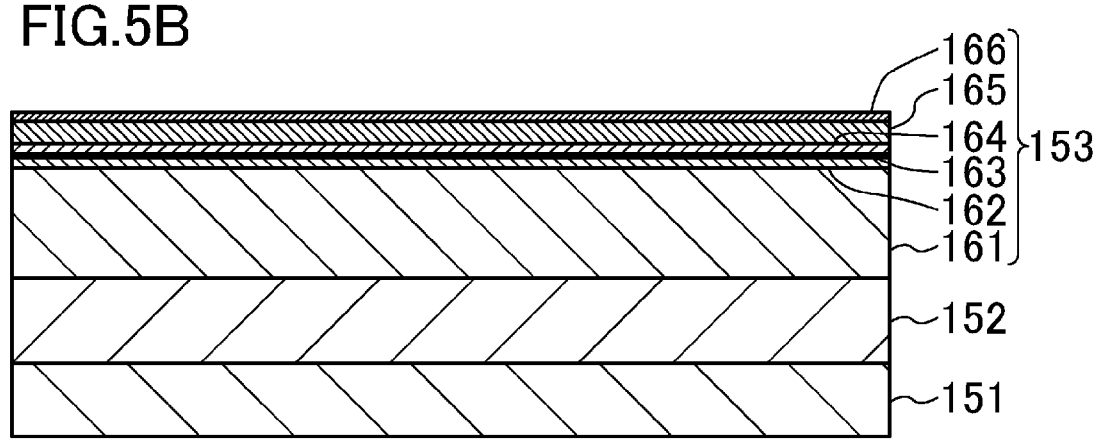

The super luminescent diode array 111 can be formed in the following manner. First, as illustrated in FIG. 5, a semiconductor laminated structure 153 including an n-type cladding layer 161, an n-type guide layer 162, a light-emitting layer 163, a p-type guide layer 164, a p-type cladding layer 165, and a p-type contact layer 166 is formed on a GaN substrate 151 having an n-type conductivity with an n-type buffer layer 152 interposed therebetween. The n-type cladding layer 161 can be aluminum gallium nitride (AlGaN), and the n-type guide layer can be GaN. The light-emitting layer 163 can be a quantum well light-emitting layer of indium gallium nitride (InGaN). The p-type guide layer 164 can be GaN. The p-type cladding layer can be AlGaN. The p-type contact layer can be GaN. The n-type layers can be doped with silicon (Si). The p-type layers can be doped with magnesium (Mg).

Figure 6A:
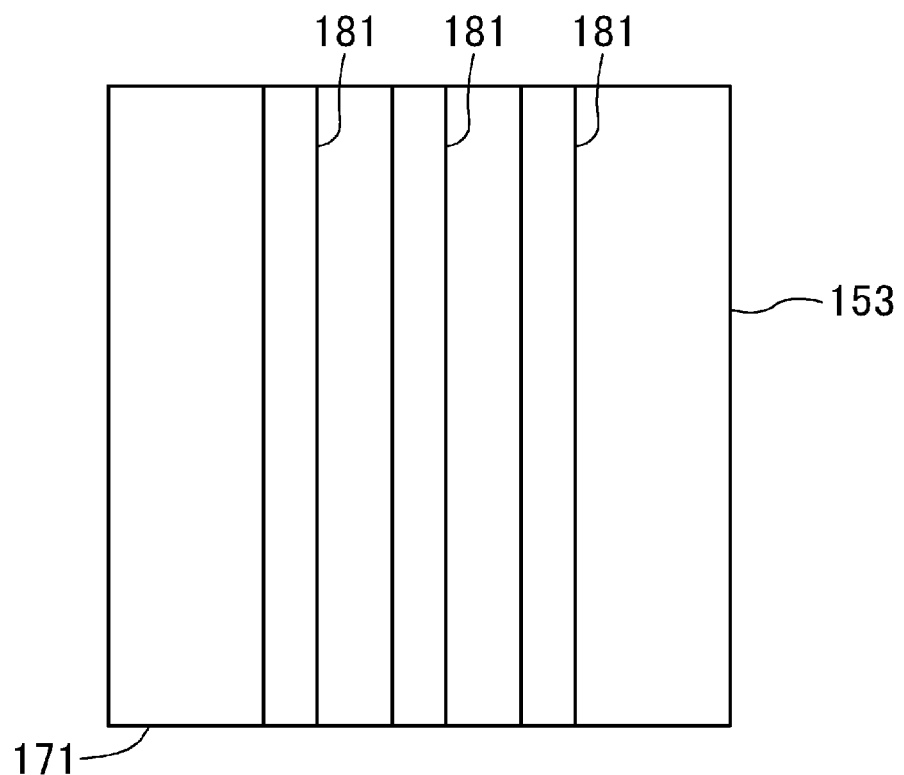
FIGS. 6(a) and 6(b) illustrate a step of the fabrication process of the super luminescent diode array of the first embodiment.
Figure 6B:
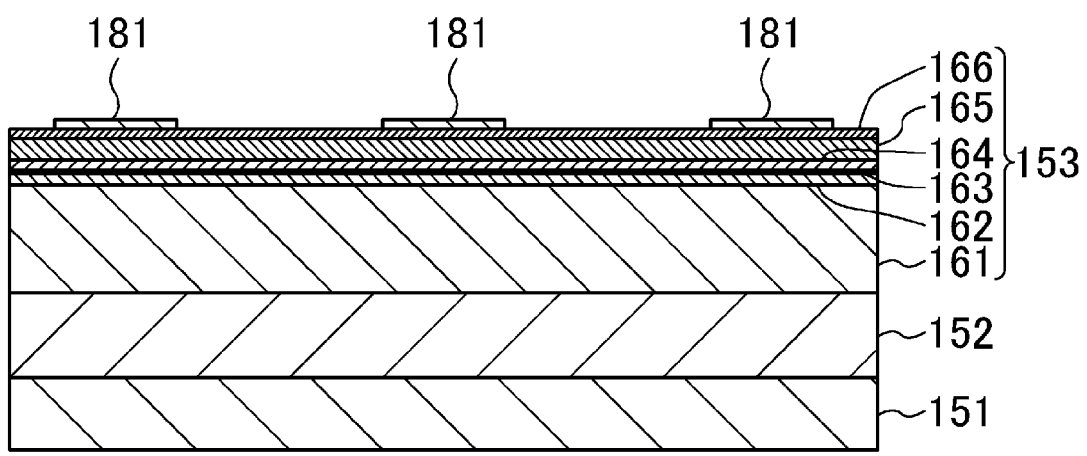

Then, as illustrated in FIG. 6, a $SiO_2$ layer 181 to be a mask is formed on the p-type contact layer 166 by plasma chemical vapor deposition (CVD). Thereafter, the $SiO_2$ layer except for portions to be ridges 154 is selectively removed by photolithography and dry etching.

Figure 7A:
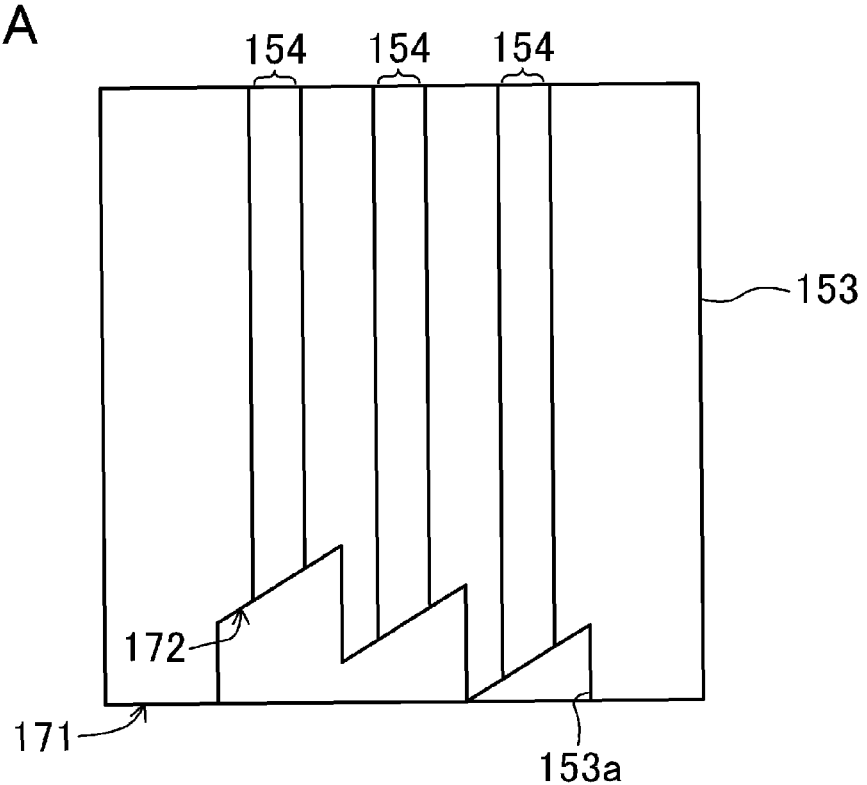
FIGS. 7(a) and 7(b) illustrate a step of the fabrication process of the super luminescent diode array of the first embodiment.
Figure 7B:
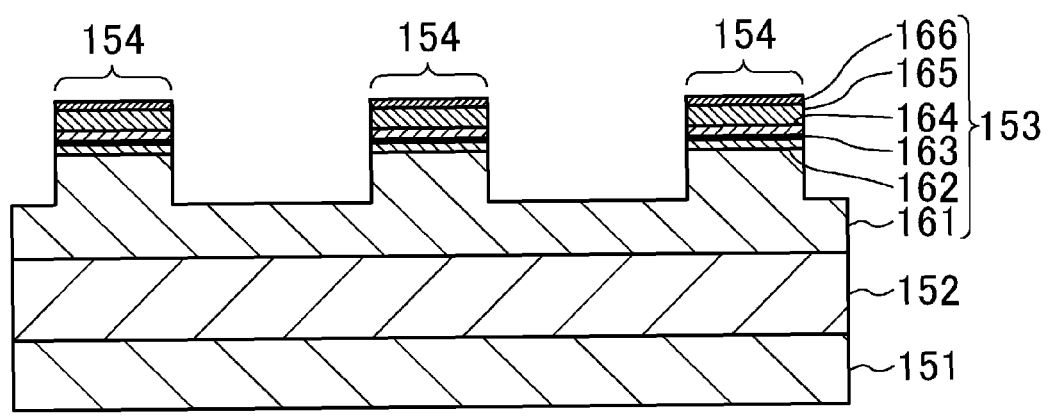
Figure 8A:
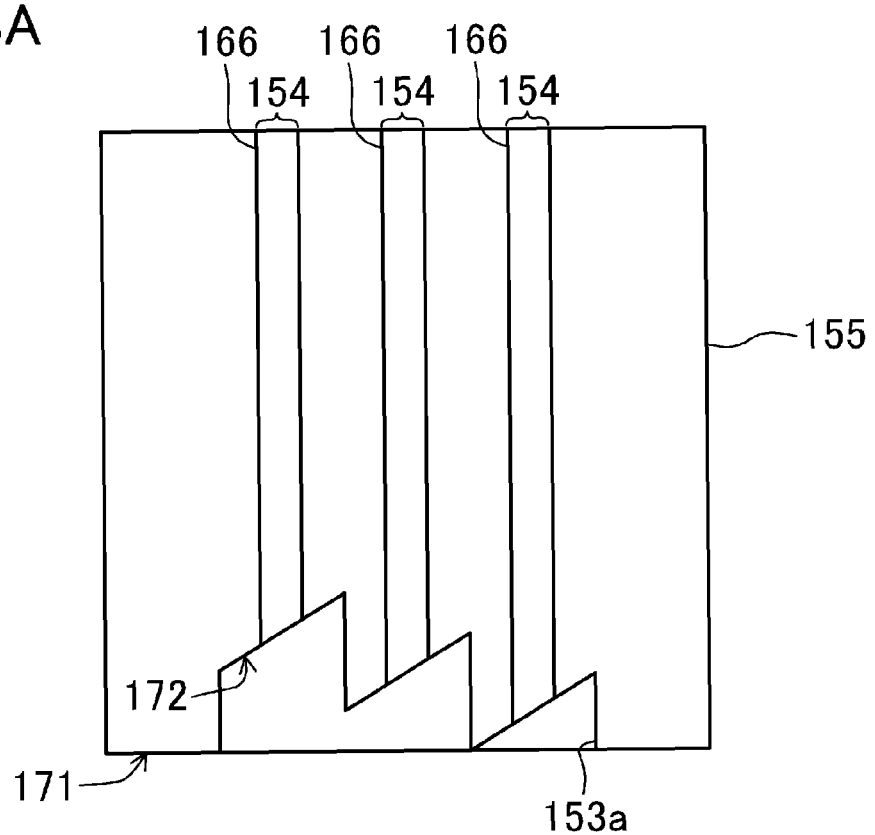
FIGS. 8(a) and 8(b) illustrate a step of the fabrication process of the super luminescent diode array of the first embodiment.
Figure 8B:
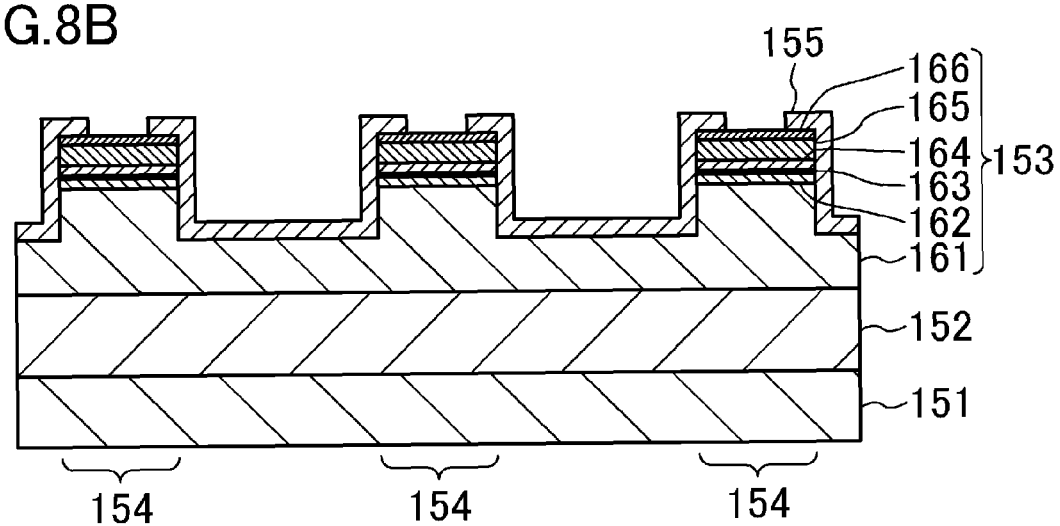

Subsequently, as illustrated in FIG. 7, using the $SiO_2$ layer 181 as a mask, the semiconductor laminated structure 153 is dry etched with, for example, a chlorine ($Cl_2$) gas until the n-type cladding layer 161 is exposed. Thereafter, the $SiO_2$ layer 181 is removed by wet etching using, for example, hydrogen fluoride. Further, using a mask of $SiO_2$ and dry etching, grooves 153a are formed. At this time, the grooves 153a are adjusted such that the light emission points of the ridges 154 satisfy the positional relationship as described above. Then, as illustrated in FIG. 8, a protection layer 155 of, for example, $SiO_2$ is formed on the entire surface of the semiconductor laminated structure 153. Subsequently, using photolithography and wet etching with hydrogen fluoride, a striped pattern of openings in which the upper surface of the p-type contact layer 166 is formed in the protection layer 155.

Figure 9A:
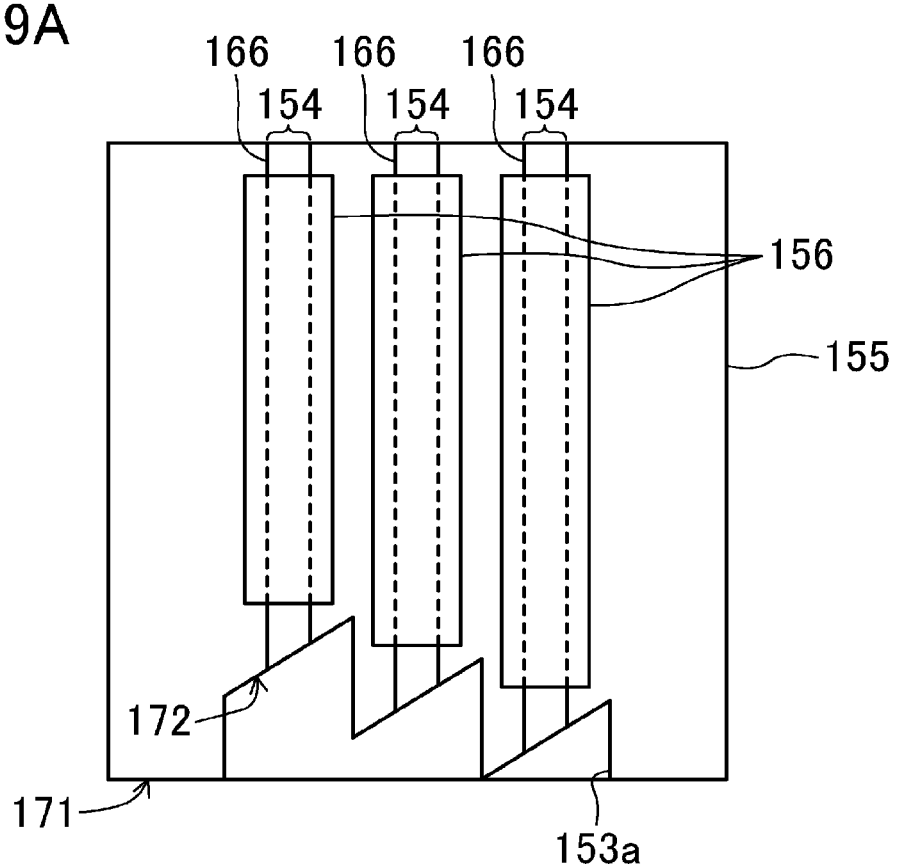
FIGS. 9(a) and 9(b) illustrate a step of the fabrication process of the super luminescent diode array of the first embodiment.
Figure 9B:
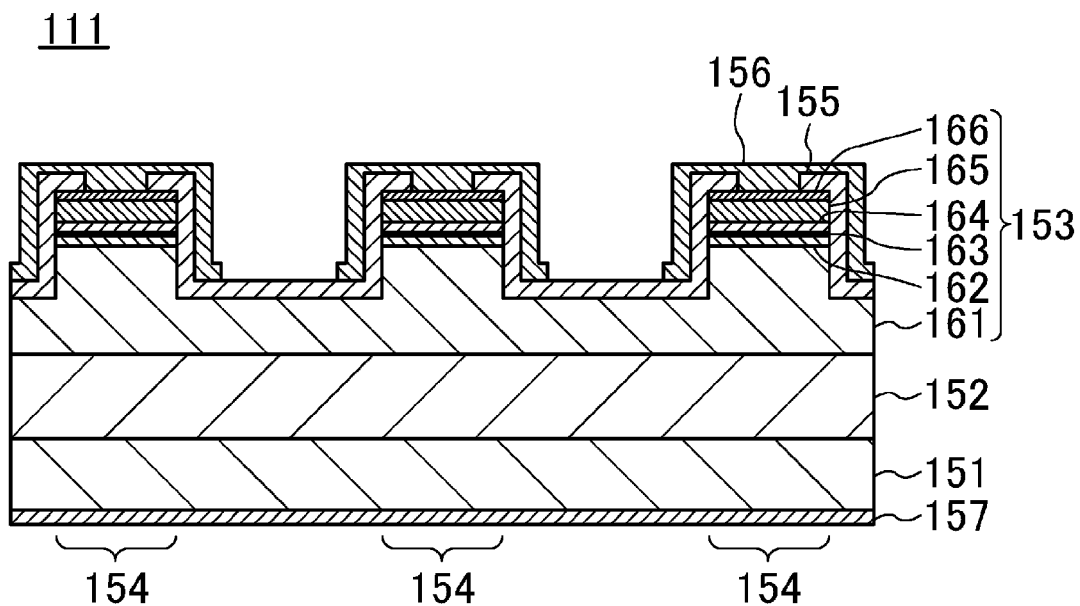

Thereafter, as illustrated in FIG. 9, using photolithography and vacuum deposition, a p-side electrode 156 electrically connected to the p-type contact layer 166 is formed. In addition, using photolithography and vacuum deposition, an n-side electrode 157 made of a multilayer film of, for example, Ti, Al, Ni, and Au is formed on the back surface of the substrate 151. Subsequently, dicing or cleavage using a blade is performed, thereby separating the chip.

In the foregoing description, etching for forming the ridges 154 is performed until the n-type cladding layer 161 is exposed. Alternatively, the ridges 154 can function as long as etching is performed at least until the p-type cladding layer 165 is exposed. By reducing the depth of etching for forming the ridges 154, leakage current flowing on the sides of the ridges 154 can be reduced.

Figure 10:
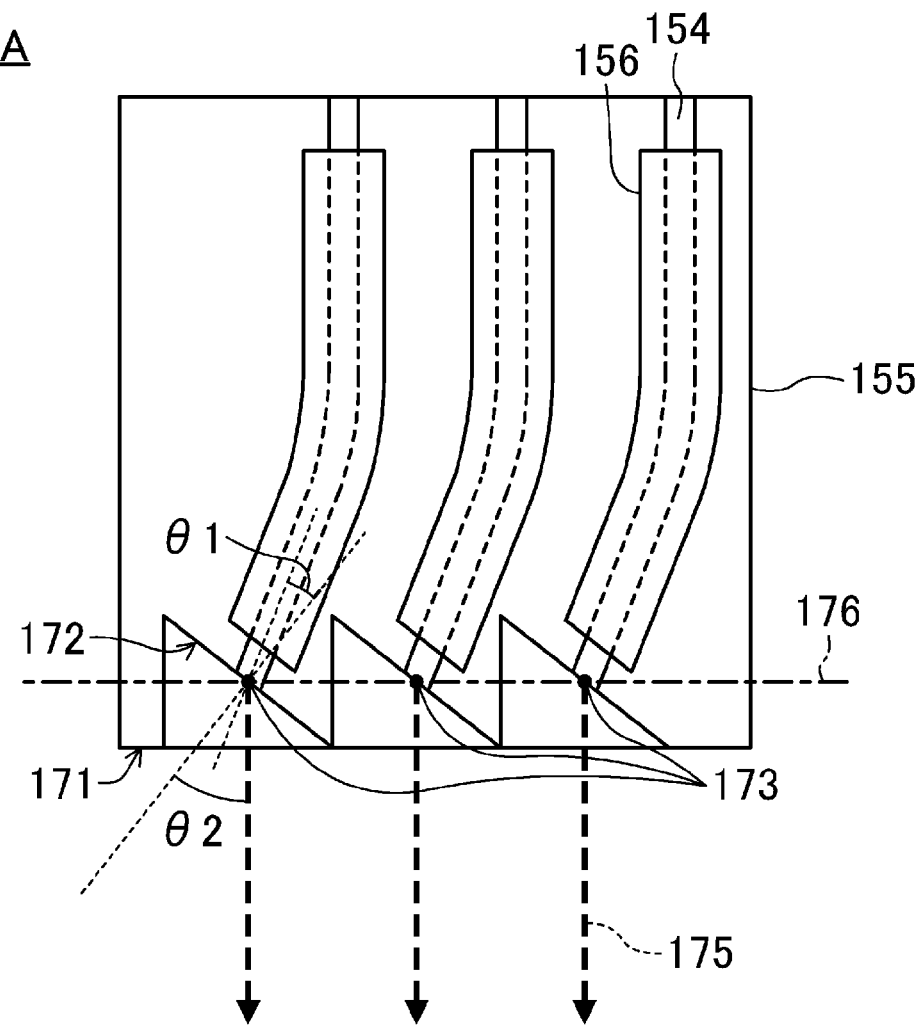
FIG. 10 is a plan view illustrating a variation of the super luminescent diode array of the first embodiment.
Figure 11:
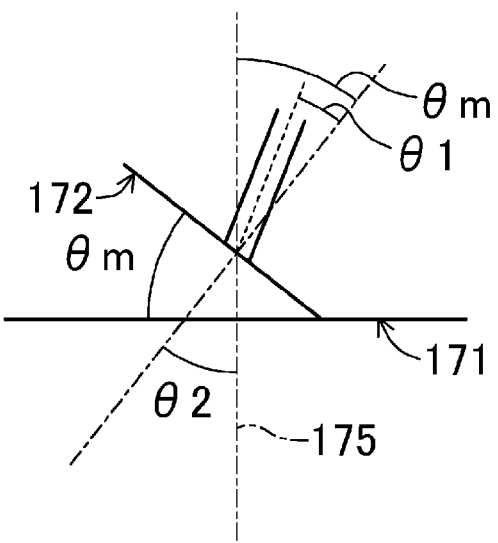
FIG. 11 is a plan view for explaining a positional relationship between a light-emitting facet and a cleavage plane.

In the foregoing description, the super luminescent diode array has straight ridges. Alternatively, as illustrated in FIG. 10, a super luminescent diode array 111A including curved ridges may be employed. In this case, the optical axes of light beams emitted from the ridges 154 can be perpendicular to the front-end surface (the cleavage plane) of a chip including the super luminescent diode array 111A. The direction of the optical axes of light beams emitted from the ridges 154 is determined by the direction of the light-emitting facet 172. The angle (the inclination angle of the light-emitting facet 172) θm between the light-emitting facet 172 and the front-end surface 171 in a case where the optical axes 175 of light beams emitted from the ridges 154 are perpendicular to the front-end surface 171 of the chip, is equal to the angle θ2 between the normal of the light-emitting facet 172 and the optical axes 175 of the light beams emitted from the ridges, as illustrated in FIG. 11. As described above, the angle θ2 is calculated by arcsin(1/n×sin θ1). For example, if the angle θ1 between the normal of the light-emitting facet and the center axis of the ridge is 10° and the refractive index n of the ridge is 2.4, the angle θ2 is 24.6°. Accordingly, in a case where the optical axis of a light beam emitted from a light emission point is perpendicular to the front-end surface of the chip, the light-emitting facet is inclined 24.6° to the front-end surface of the chip. In this case, the direction of the center axis of the ridge coincides with the direction of the center axis of the ridge in the light-emitting facet.

In a case where the ridges are curved, the cleavage plane of the chip is in parallel with the light emission plane. Accordingly, in packaging the super luminescent diode chip, the front-end surface of the chip only needs to be perpendicular to the optical axis of the collimator lens. As a result, chip alignment becomes easy.

In this embodiment, super luminescent diode array has three ridges. Alternatively, the number of ridges may be two, or four or more.

Figure 12:
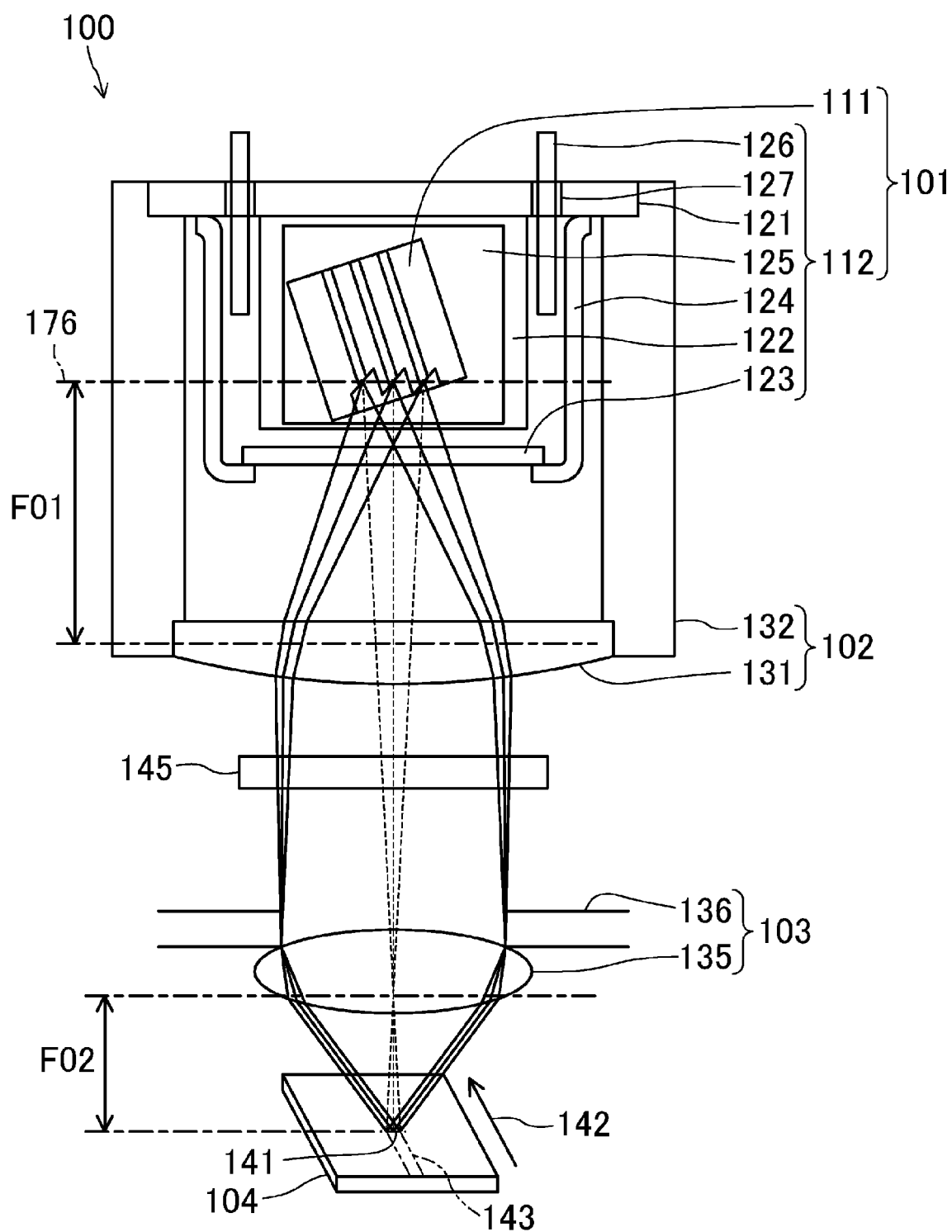
FIG. 12 is a view schematically illustrating a variation of the optical irradiation apparatus of the first embodiment.

In the example illustrated in FIG. 1, light beams collected by the condenser lens is directly applied onto the irradiation object. Alternatively, as illustrated in FIG. 12, a polarizer 145 may be inserted on an optical path. The polarizer 145 can be, for example, a quarter-wave plate (a λ/4 plate). In this case, feedback light reflected on the irradiation object can reduce oscillation of the super luminescent diode. In FIG. 12, the polarizer 145 is located between the collimator part 102 and the light condensing part 103. However, the polarizer 145 may be inserted at any place on the optical path of the irradiating light.

Figure 13:
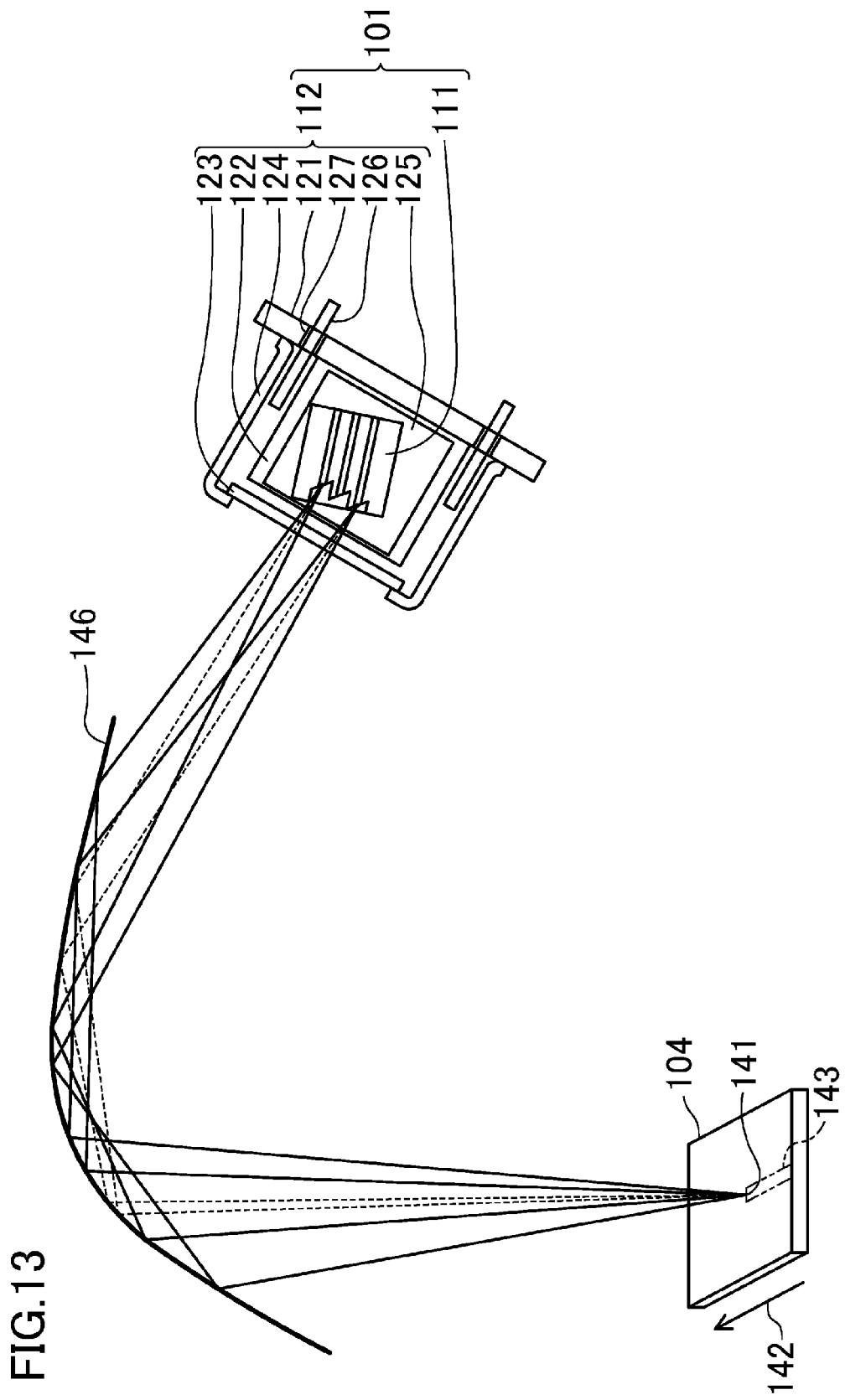
FIG. 13 is a view schematically illustrating a variation of the optical irradiation apparatus of the first embodiment.

In the example illustrated in FIG. 1, each of the collimator part and the light condensing part is a dioptric system using a lens. However, at least one of the collimator part and the light condensing part may be a catoptric system using a reflecting mirror. For example, as illustrated in FIG. 13, a reflecting mirror 146 serving as a collimator part and a light condensing part may be employed. The use of a catoptric system can eliminate light collection displacement due to chromatic aberration. Since a super luminescent diode has an emission spectrum wider than that of a laser diode, the use of a catoptric system is advantageous. Each of the collimator part and the light condensing part may be an independent reflecting mirror. A configuration in which one of the collimator part and the light condensing part is a reflecting mirror and the other is a lens, may be employed. The collimator part may be a diffraction grating, for example.

Second Embodiment

Figure 14:
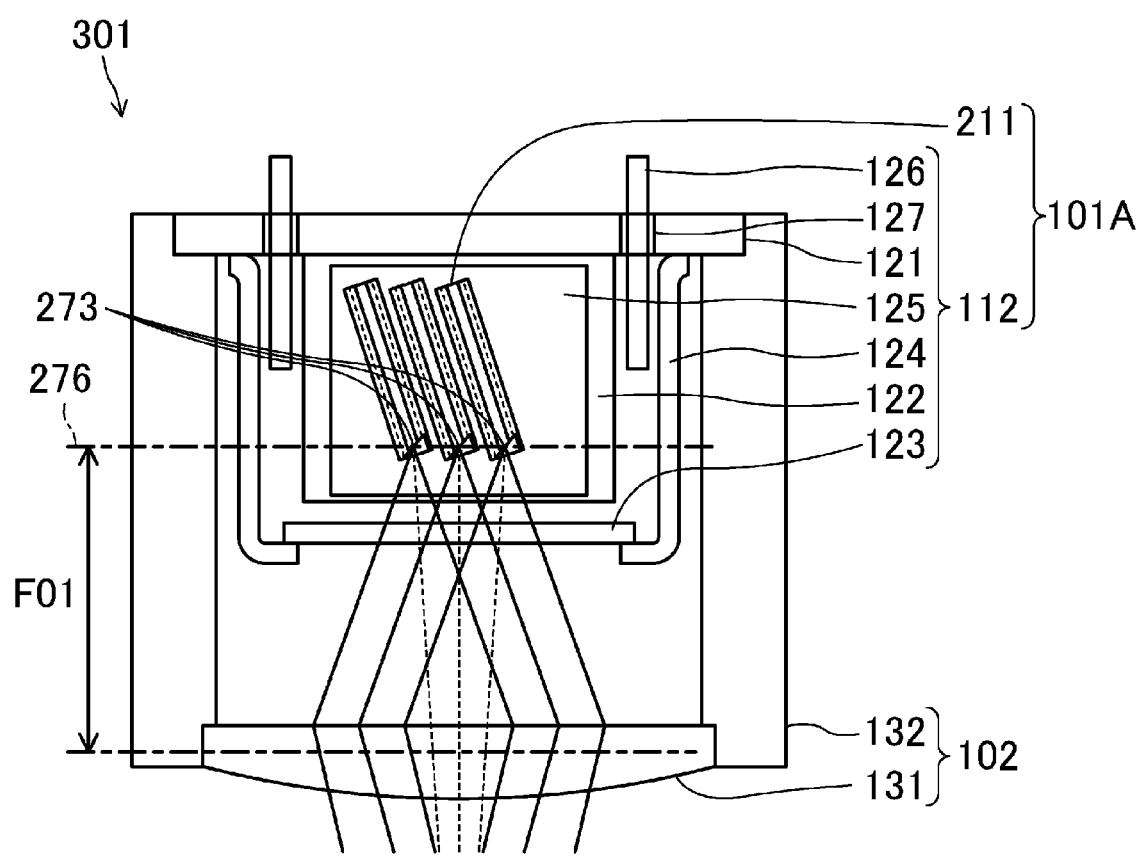
FIG. 14 is a view schematically illustrating an optical irradiation apparatus according to a second embodiment.

In the first embodiment, the super luminescent diode array including a plurality of ridges is used as a light source. Alternatively, a plurality of super luminescent diodes may be used as light sources. FIG. 14 illustrates a configuration of an optical irradiation apparatus according to a second embodiment. In FIG. 14, elements already shown in FIG. 1 are designated by the same reference characters. The light condensing part will not be described. The optical irradiation apparatus of the second embodiment has a feature of using a semiconductor light-emitting device 101A incorporating a plurality of super luminescent diode chips as light sources.

In the semiconductor light-emitting device 101, three super luminescent diode chips 211 are housed in a case 112. The three super luminescent diode chips 211 are fixed on a submount 125 such that ridges of the super luminescent diode chips 211 extend in the same direction. Light emission points 273 of the three super luminescent diode chips 211 are located within a light emission plane 276. The light emission plane 276 is perpendicular to the optical axis of a collimator lens 131.

In the same manner as in the first embodiment, an optical irradiation apparatus showing reduced interference noise and achieving a uniform distribution of the irradiating light intensity can also be obtained in the second embodiment.

In the example illustrated in FIG. 14, the three super luminescent diode chips are used. Alternatively, the number of super luminescent diode chips may be two, or four or more.

The above super luminescent diode chips include straight ridges. Alternatively, the ridges may be curved. In this case, in each of the chips, the front-end surface is in parallel with the light emission plane. Accordingly, chip alignment becomes easy in packaging the super luminescent diode chips.

In this embodiment, a polarizing plate may also be inserted on an optical path, and the optical system may also be a catoptric system.

Third Embodiment

Figure 15:
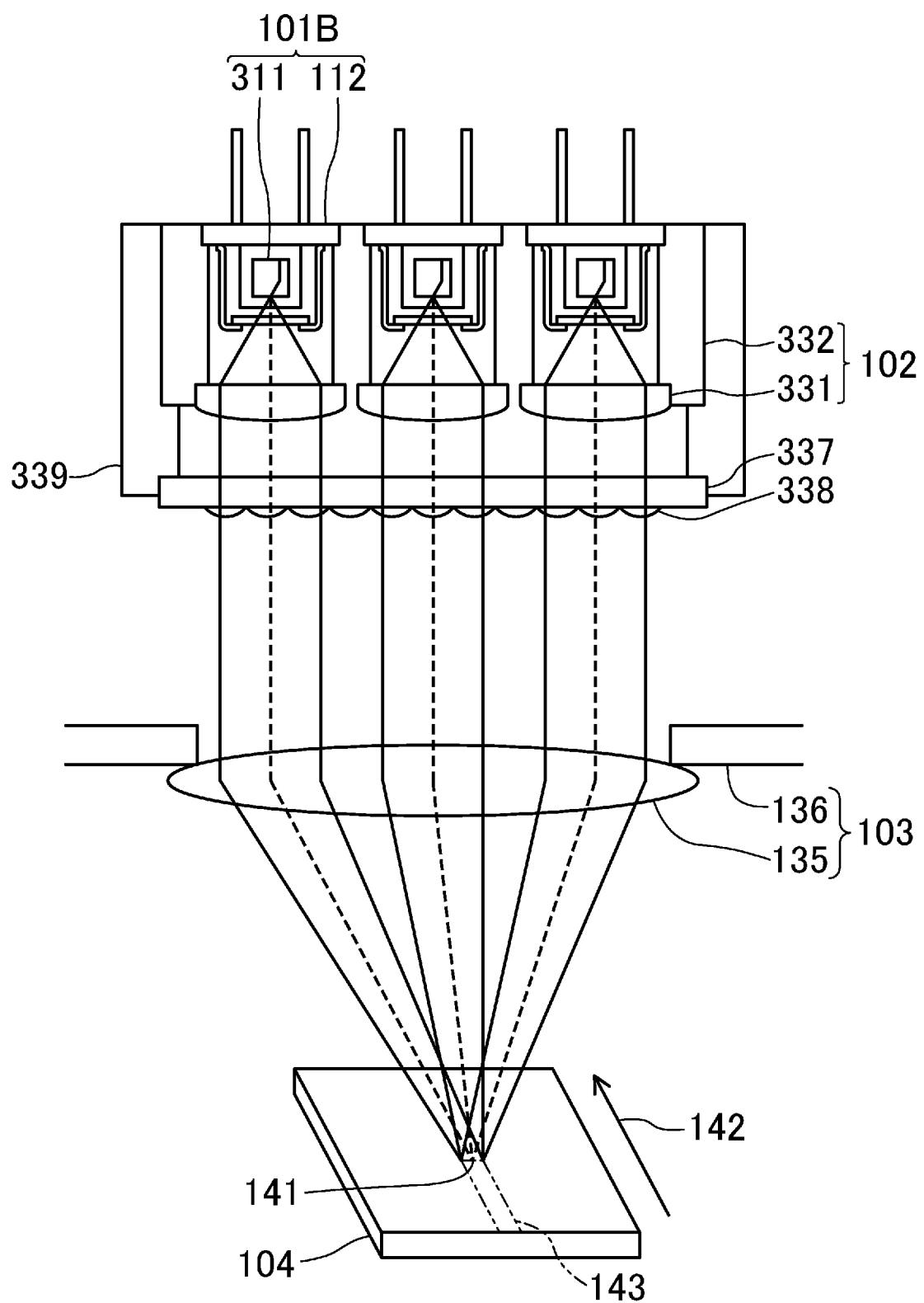
FIG. 15 is a view schematically illustrating an optical irradiation apparatus according to a third embodiment.

Instead of the semiconductor light-emitting device incorporating a plurality of super luminescent diode chips, a plurality of semiconductor light-emitting devices each including a super luminescent diode chip may be used as light sources. FIG. 15 illustrates a configuration of an optical irradiation apparatus according to a third embodiment. In FIG. 15, elements already shown in FIG. 1 are designated by the same reference characters. The optical irradiation apparatus of the third embodiment has a feature of using, as light sources, a plurality of semiconductor light-emitting devices 101B each including a super luminescent diode chip.

In FIG. 15, a collimator lens 331 is provided for each of the semiconductor light-emitting devices 101B. Each of the collimator lenses 331 is fixed by a first fixture part 332 such that the optical axis of the collimator lens 331 coincides with the optical axis of a light beam emitted from the associated one of the semiconductor light-emitting devices 101B. A fly-eye lens 337 and microlenses 338 are provided between the collimator lenses 331 and the condenser lens 135. The fly-eye lens 337 and the microlenses 338 are fixed by a third fixture part 339.

Figure 16:
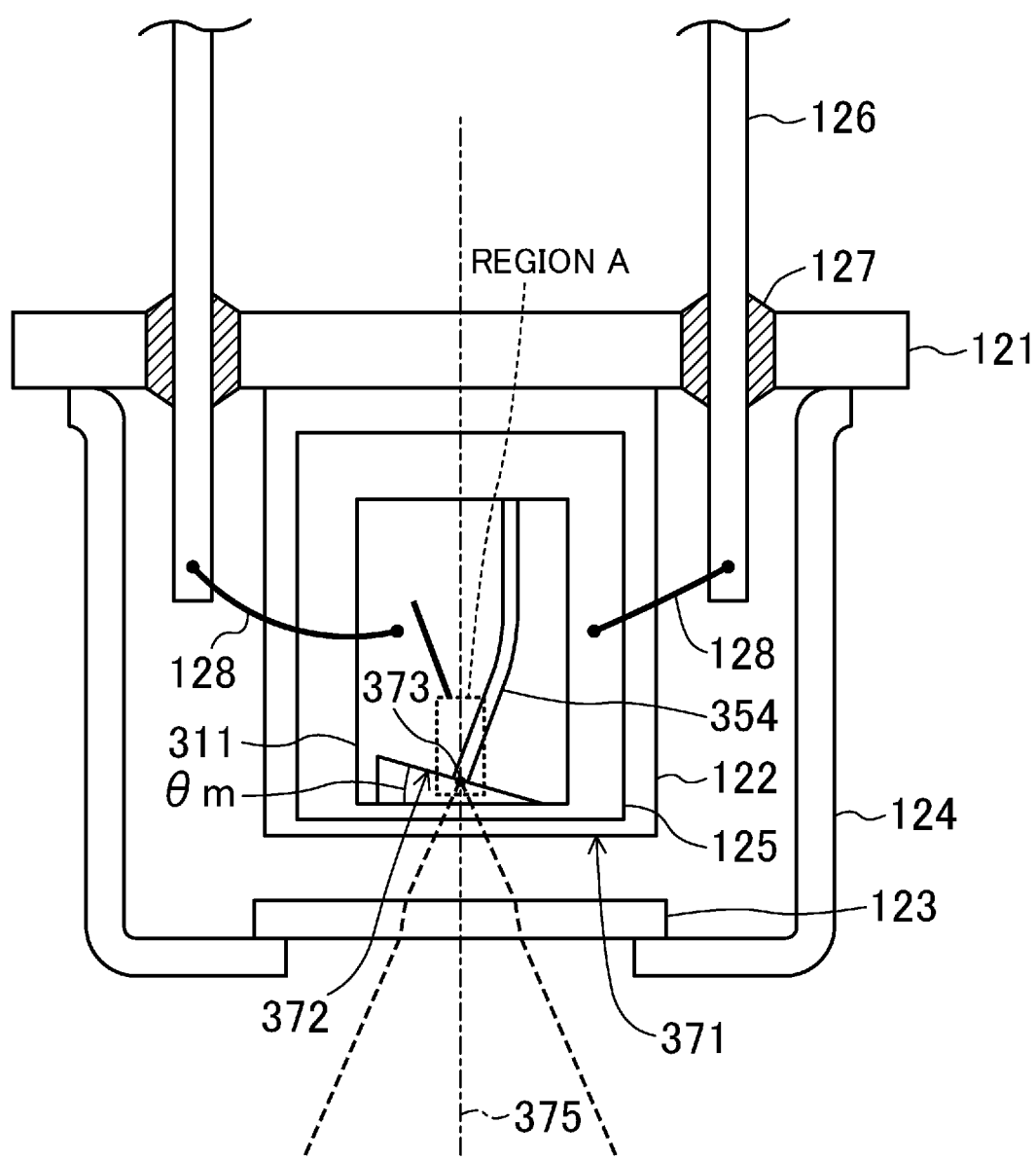
FIG. 16 is a view schematically illustrating a semiconductor light-emitting device according to the third embodiment.

FIG. 16 is an enlarged view illustrating the semiconductor light-emitting device 101B. The super luminescent diode chip 311 has a curved ridge 354. The inclination angle θm of a light-emitting facet 372 is adjusted such that an optical axis 375 of a light beam emitted from a light emission point 373 is orthogonal to a front-end surface 371 which is a cleavage plane of the super luminescent diode chip 311. Specifically, as described above, the angle θ1 between the normal of the light-emitting facet and the center axis of the ridge is 10°. If the refractive index of the ridge is 2.4, θm is 24.6°.

The super luminescent diode chip 311 is fixed to a submount 125 such that the optical axis of a light beam to be emitted is perpendicular to the principal surface of a cover glass 123 which is a reference plane of the semiconductor light-emitting device 101B. A p-side electrode of the super luminescent diode chip 311 is connected to a lead 126 by a wire 128. An n-side electrode is connected to another lead 126 by a wire 128 connected to the submount 125.

Figure 17:
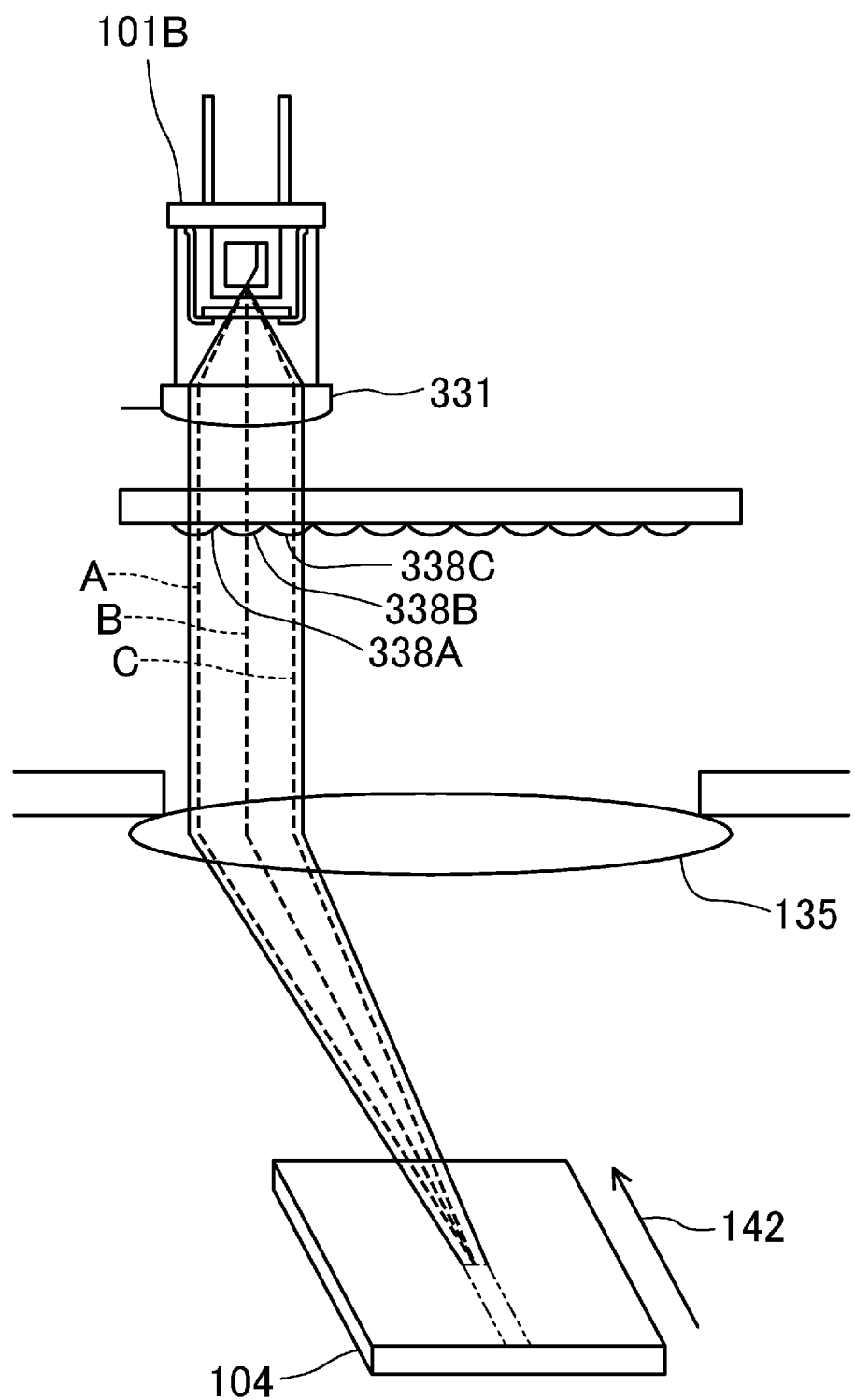
FIG. 17 is a schematic view for describing a light collection path in the optical irradiation apparatus of the third embodiment.
Figure 18:
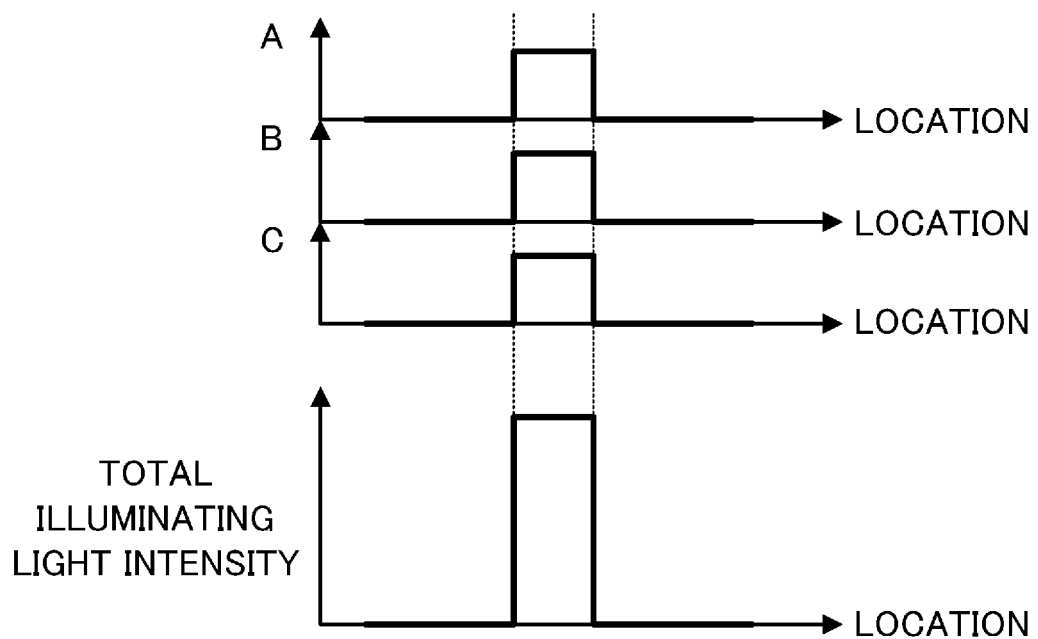
FIG. 18 is a graph showing a distribution of the irradiating light intensity in the optical irradiation apparatus of the third embodiment.

As illustrated in FIG. 17, light beams emitted from the semiconductor light-emitting device 101B are converted into parallel light beams by the collimator lens 331, and enter the fly-eye lens 337 and the microlenses 338. When irradiating an irradiation object 104, irradiating light A which has entered a microlens 338A, irradiating light B which has entered a microlens 338B, and irradiating light C which has entered a microlens 338C are changed into light showing substantially uniform distributions of the irradiating light intensity with approximate rectangular shapes. In FIG. 18, the ordinate represents the irradiating light intensity, and the abscissa represents the location in the direction perpendicular to a scanning direction 142.

FIGS. 17 and 18 show only one semiconductor light-emitting device. However, light beams emitted from the other semiconductor light-emitting devices which are not shown also show similar distributions of the irradiating light intensity. Accordingly, in the optical irradiation region, all the light showing approximately rectangular distributions of the irradiating light intensity formed by the microlenses are added together, the resultant collected light is hardly affected by aberration. Accordingly, in a manner similar to those in the first and second embodiments, an optical irradiation apparatus showing reduced interference noise and achieving a uniform distribution of the irradiating light intensity can also be obtained in the third embodiment.

In the example illustrated in FIG. 12, the three semiconductor light-emitting devices are used. Alternatively, the number of semiconductor light-emitting devices may be two, or four or more. Each of the semiconductor light-emitting devices may be a semiconductor light-emitting device using a super luminescent diode array or a semiconductor light-emitting device including a plurality of super luminescent diode chips.

In this embodiment, a polarizing plate may also be inserted on an optical path, and the optical system may also be a catoptric system.

In the foregoing embodiments, the waveguide is a ridge waveguide, but may be a buried waveguide.

As described above, an optical irradiation apparatus according to the present disclosure can efficiently apply light with high light output and low interference noise. Thus, the present disclosure is useful especially for, for example, an optical irradiation apparatus heating an irradiation object or causing photochemical reaction in the irradiation object.

What is claimed is:

1. An optical irradiation apparatus, comprising:
   a light-emitting device configured to emit a plurality of light beams whose optical axes extend in a substantially identical direction; and
   a collimator part configured to collimate the plurality of light beams, wherein:
   the light-emitting device includes:
   a front-end surface;
   a plurality of super luminescent diodes; and
   a plurality of waveguides, each of which is provided for a corresponding one of the plurality of super luminescent diodes,
   each of the plurality of waveguides has a light-emitting facet including a light emission point from which an associated one of the plurality of light beams is emitted,
   the light-emitting facet is different from the front-end surface,
   the light emission points are located in a plane orthogonal to a direction of an optical axis of the collimator part, and
   the plane including the light emission points is inclined to the front-end surface of the light-emitting device.

2. The optical irradiation apparatus of claim 1, wherein each of the plurality of waveguides is straight.

3. The optical irradiation apparatus of claim 2, wherein a distance L between the light emission points of adjacent two of the plurality of waveguides along a direction in which the plurality of waveguides extend is expressed by the following equation:

$$L = P / \tan(\theta_1 + (90° - \theta_2))$$

where $\theta_1$ is an angle between the direction in which the plurality of waveguides extend and a normal of the light-emitting facet, $\theta_2$ is an angle between the normal of the light-emitting facet and the optical axis of the light beam, and P is a distance between center axes of adjacent two of the plurality of waveguides.

4. The optical irradiation apparatus of claim 3, wherein θ2 is expressed by the following equation:

$$\theta 2 = \arcsin(1/n \times \sin \theta 1)$$

where n is a refractive index of the plurality of waveguides.

5. The optical irradiation apparatus of claim 1, further comprising a polarizing plate provided on an optical path of each of the plurality of light beams.

6. The optical irradiation apparatus of claim 5, wherein the polarizing plate is a λ/4 plate.

7. The optical irradiation apparatus of claim 1, wherein irradiation is performed in such a manner that an optical axis of irradiating light collected by the light condensing part is shifted from a line perpendicular to an irradiation surface of an irradiation object.

8. The optical irradiation apparatus of claim 1, wherein the plurality of light beams are emitted from a side face of the light-emitting device.

9. The optical irradiation apparatus of claim 1, wherein the collimator part is configured to collimate the plurality of light beams into substantially parallel light beams, respectively.

10. The optical irradiation apparatus of claim 1, further comprising a light condensing part configured to collect the parallel light beams.

11. The optical irradiation apparatus of claim 10, wherein the collimator part is a collimator lens, and the light condensing part is a condenser lens.

12. The optical irradiation apparatus of claim 10, wherein at least one of the collimator part or the light condensing part is a catoptric system.

13. The optical irradiation apparatus of claim 1, wherein:
the light-emitting device further includes a single substrate, and
the plurality of waveguides are disposed on the single substrate.

14. The optical irradiation apparatus of claim 1, wherein:
the light-emitting device further includes a plurality of separate substrates, and
each of the plurality of waveguides is disposed on a corresponding one of the plurality of separate substrates.

15. The optical irradiation apparatus of claim 1, wherein the collimator part includes a collimator lens.

16. The optical irradiation apparatus of claim 15, wherein the collimator lens collimates the plurality of light beams after the associated one of the plurality of light beams is emitted from the light emission point.

17. The optical irradiation apparatus of claim 1, wherein the front-end surface is a cleavage plane.

18. The optical irradiation apparatus of claim 1, wherein the front-end surface is inclined to the light-emitting facet.

19. The optical irradiation apparatus of claim 1, wherein the plane including the light emission points is inclined to the light-emitting facet.

20. The optical irradiation apparatus of claim 1, wherein in plan view, each of the plurality of waveguides has a different full length from one another.

* * * * *